US006810511B2

(12) United States Patent
Chen et al.

(10) Patent No.: US 6,810,511 B2
(45) Date of Patent: Oct. 26, 2004

(54) METHOD OF DESIGNING ACTIVE REGION PATTERN WITH SHIFT DUMMY PATTERN

(75) Inventors: Coming Chen, Taoyuan Hsien (TW); Juan-Yuan Wu, Hsinchu (TW); Water Lur, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 184 days.

(21) Appl. No.: 10/284,683

(22) Filed: Oct. 30, 2002

(65) Prior Publication Data

US 2003/0056191 A1 Mar. 20, 2003

Related U.S. Application Data

(63) Continuation of application No. 09/724,008, filed on Nov. 28, 2000, now abandoned, which is a continuation of application No. 09/114,052, filed on Jul. 10, 1998, now Pat. No. 6,178,543, which is a continuation-in-part of application No. 08/648,618, filed on May 16, 1996, now Pat. No. 5,902,752.

(30) Foreign Application Priority Data

May 15, 1998 (TW) ........................ 87107569 A

(51) Int. Cl.$^7$ ..................... G06F 17/50; H01L 25/00; H03K 19/00
(52) U.S. Cl. ..................... 716/10; 716/12; 716/21; 326/15; 326/47; 326/101
(58) Field of Search .................. 716/10, 12, 21; 326/15, 47, 101

(56) References Cited

U.S. PATENT DOCUMENTS 5,278,105 A * 1/1994 Eden et al. ................. 438/129
5,341,049 A * 8/1994 Shimizu et al. ............. 326/101
5,438,281 A * 8/1995 Takahashi et al. ........... 326/86
6,311,147 B1 * 10/2001 Tuan et al. .................. 703/18

FOREIGN PATENT DOCUMENTS

| JP | 63025883 A | * | 2/1988 | ........... G11C/11/34 |
| JP | 01138681 A | * | 5/1989 | ........... G11C/11/34 |
| JP | 03117113 A | * | 5/1991 | ......... H03K/17/687 |
| JP | 03207079 A | * | 9/1991 | ......... G11C/11/401 |
| JP | 09321595 A | * | 12/1997 | ......... H03K/17/687 |

OTHER PUBLICATIONS

Kim et al., "An isolated–open pattern to de–embled pad parasitics [CMOSFETs]", IEEE Microwave and Guided Wave Letters, Vo 8, No. 2, Feb. 1998, pp. 96–98.*

* cited by examiner

Primary Examiner—Matthew Smith
Assistant Examiner—Phallaka Kik
(74) Attorney, Agent, or Firm—J.C. Patents

(57) ABSTRACT

A method of designing an active region pattern with a shifted dummy pattern, wherein an integrated circuit having an original active region pattern thereon is provided. The original active region pattern is expanded with a first parameter of line width to obtain a first pattern. By subtracting the first pattern, a second pattern is obtained. A dummy pattern which comprises an array of a plurality of elements is provided. By shifting the elements, a shifted dummy pattern is obtained. The second pattern and the shifted dummy pattern are combined, so that an overlapped region thereof is extracted as a combined dummy pattern. The combined dummy pattern is expanded with a second parameter of line width, so that a resultant dummy pattern is obtained. The resultant dummy pattern is added to the first pattern, so that the active region pattern with a shifted dummy pattern is obtained.

16 Claims, 7 Drawing Sheets

METHOD OF DESIGNING ACTIVE REGION PATTERN WITH SHIFT DUMMY PATTERN

CROSS-REFERENCE TO RELATED APPLICATION

This application is a continuation application of, and claims the priority benefit of, U.S. application Ser. No. 09/724,008 filed on Nov. 28, 2000 now abandoned, which was a continuation of U.S. patent application Ser. No. 09/114,052, filed Jul. 10, 1998, now U.S. Pat. No. 6,178,543, which was a continuation-in-part of U.S. patent application Ser. No. 08/648,618, filed May 16, 1996, now U.S. Pat. No. 5,902,752.

BACKGROUND OF THE INVENTION

1. Field of the Invention

The invention relates in general to a method of designing an active region pattern with a shift dummy pattern, and more particularly, to a method adding a shift dummy pattern into an diffusion region for the process of forming a shallow trench isolation. Therefore, a better planarization effect is obtained in the subsequent process of chemical mechanical polishing (CMP), and a circuit problem induced by various parasitic capacitors is resolved.

2. Description of the Related Art

As the design of an integrated circuit is more and more complex, the line width of fabrication process reduced narrower than 1 µm causes a restriction the development of a trench isolation technique in a complementary metal-oxide-semiconductor (CMOS) is thus restricted. While performing chemical mechanical polishing for planarization, if a under layer has a pattern on which the distance between devices is over 10 µm, a dishing recess is formed on the region without a device thereon after polishing. Thus, a global planarization is affected. This is called as a dishing effect. In FIG. 1A to FIG. 1D, a shallow trench isolation formed by a conventional technique of chemical mechanical polishing is shown.

In FIG. 1A, on a semiconductor substrate 10, for example, a silicon substrate, a pad oxide layer 11 and a dielectric layer 12, for example, a silicon nitride layer are formed in sequence. Using photolithography and etching, a device region 13 is formed on the substrate 10. Using a photo-resist layer (not shown) on the device region 13 as a mask, the substrate 10 is etched, for example, by anisotropic etching, to form several trenches with certain depths. In FIG. 1B, using chemical vapor deposition (CVD), an oxide layer 14 is formed over the substrate 10. The oxide layer 14 is polished by chemical mechanical polishing with the dielectric layer 12 as a stop layer, so that several trench isolations 15, 16 are formed as shown in FIG. 1C.

After the formation of trench isolations 15, 16, subsequent processes, for example, removing the pad oxide layer 11 and the dielectric layer, forming a gate oxide layer 17 and a poly-silicon layer 18, is performed as shown in FIG. 1D. As shown in the figure, the width of each trench isolation is not identical. For example, the region of trench isolation 16 is larger than the region of the trench isolation 15. The poly-silicon layer 18 is well planarized on the trench isolation 15. On the contrary, the poly-silicon layer 18 on the trench isolation 15 has a smooth recess. Thus, using chemical mechanical polishing, only a local planarization is achieved. The global planarization cannot be achieved.

To resolve the drawback mentioned above, conventionally, a dummy pattern is added to the active region pattern to improve the uniformity of chemical mechanical polishing. However, a parasitic capacitance is induced by doing so to affect the performance of devices. The metal line on different dummy pattern causes a time delay by different parasitic capacitance, and therefore, causes a circuit problem. In FIG. 2, a conventional method of designing an active region pattern with a dummy pattern is shown. Metal lines 20, 22 are formed on different locations of the dummy pattern 24, and the dummy pattern 24 comprises columns 24a to 24d. For example, the metal line 20 is formed on a column 24c of the dummy pattern, and the metal line 22 covers a part of the column 24a and a part of the column 24b of the dummy pattern 24. Between the metal line 22 and the dummy pattern 24, different parasitic capacitance is induced in practical application, so that a problem of different time order, for example, an RC delay is caused.

SUMMARY OF THE INVENTION

It is therefore an object of the invention to provide a method of designing an active region pattern with a dummy pattern. By shifting a predetermined dummy pattern, the parasitic capacitance between each metal line and the dummy pattern is identical. Therefore, an identical RC time is obtained.

To achieve these objects and advantages, and in accordance with the purpose of the invention, as embodied and broadly described herein, the invention is directed towards a method of designing an active region pattern with a dummy pattern. An integrated circuit having an original active region pattern thereon is provided. The original active region pattern is expanded with a first parameter of line width to obtain a first pattern. By subtracting the first pattern, a second pattern is obtained. A dummy pattern which comprises an array of a plurality of elements is provided. By shifting the elements, a shifted dummy pattern is obtained. The second pattern and the shifted dummy pattern are combined, so that an overlapped region thereof is extracted as a combined dummy pattern. The combined dummy pattern is expanded with a second parameter of line width, so that a resultant dummy pattern is obtained. The resultant dummy pattern is added to the first pattern, so that the active region pattern with a shifted dummy pattern is obtained.

It is to be understood that both the foregoing general description and the following detailed description are exemplary and explanatory only and are not restrictive of the invention, as claimed.

DESCRIPTION OF THE PREFERRED EMBODIMENTS

Figure 1A:
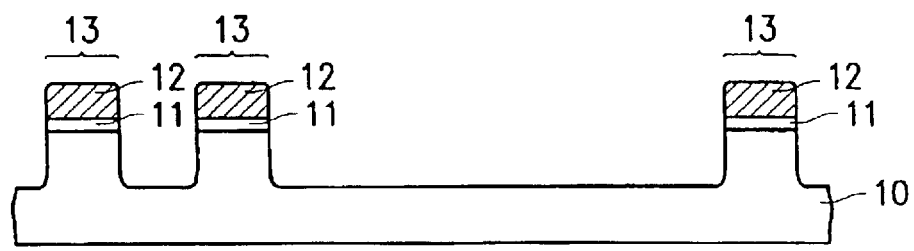
FIG. 1 to FIG. 1D shows a method of forming a shallow trench isolation by employing a conventional chemical mechanical polishing technique.
Figure 1B:
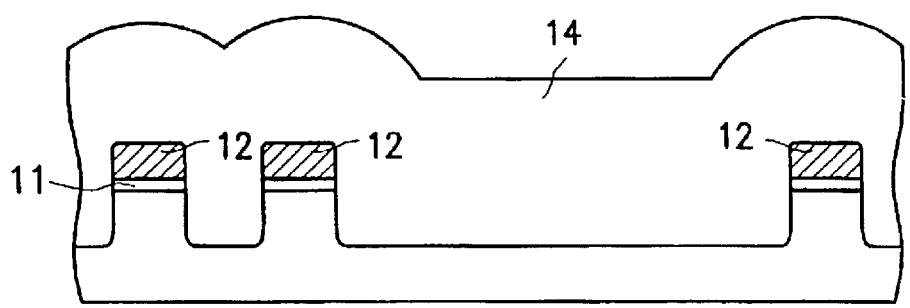
Figure 1C:
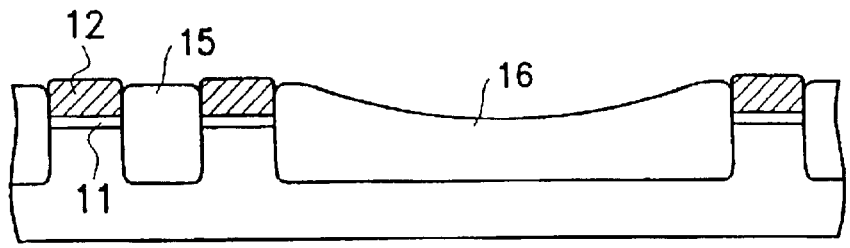
Figure 1D:
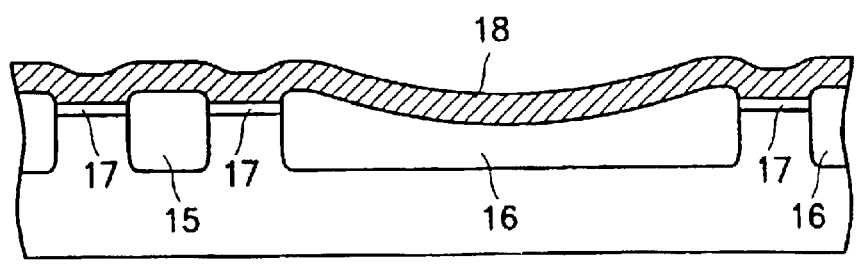
Figure 2:
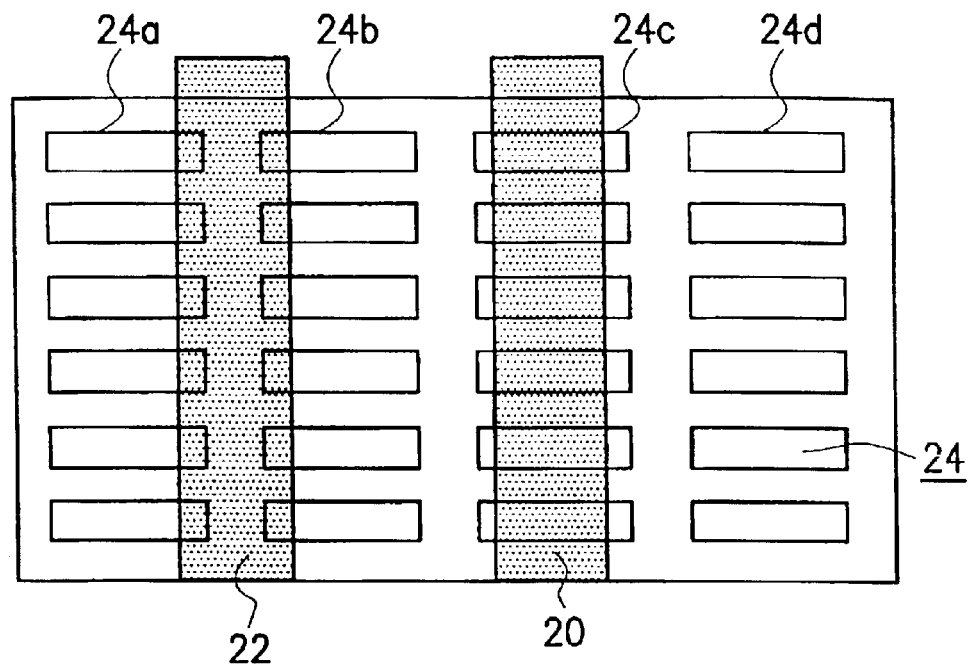
FIG. 2 shows a conventional active region pattern with a dummy pattern.
Figure 3:
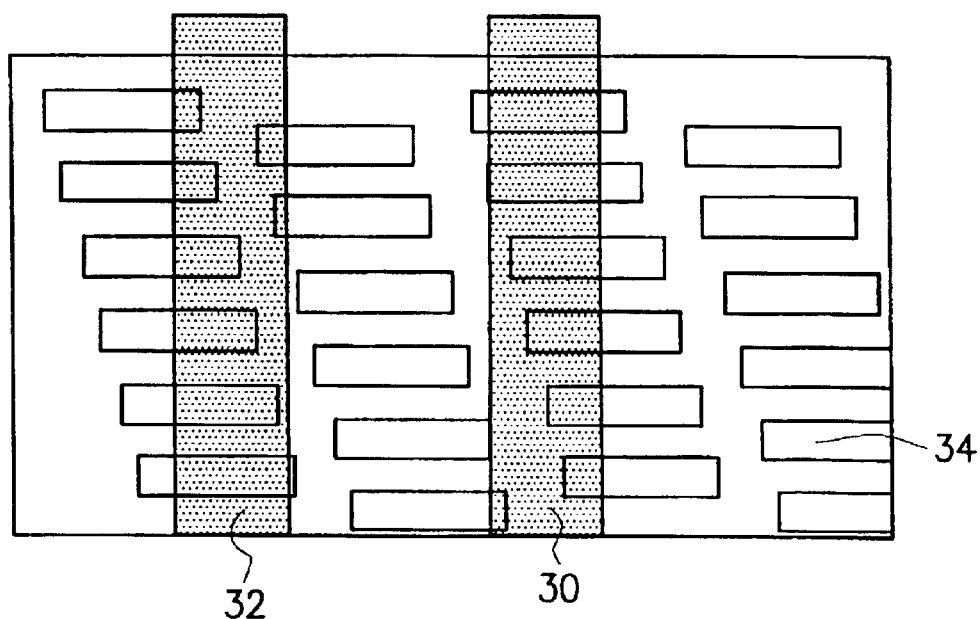
FIG. 3 shows an active region pattern with a shifted dummy pattern in a preferred embodiment according to the invention.

FIG. 3 shows an active region pattern with a shifted dummy pattern in a preferred embodiment according to the invention. As shown in FIG. 3, metal lines 30, 32 covers different parts of a dummy pattern 34. Since the dummy pattern is shifted as a certain pattern, so that the parasitic capacitance between the metal line 30 and the dummy pattern 34 is identical the parasitic capacitance between the metal line 32 and the dummy pattern 34. As a consequence, in practical circuit application, a better performance is obtained without a RC time delay problem.

Figure 4:
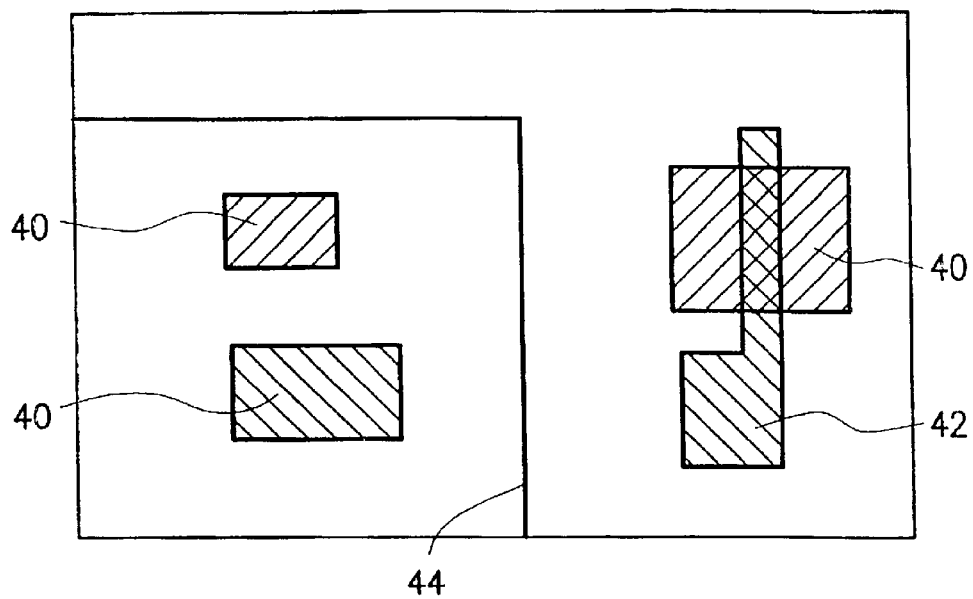
FIG. 4 shows an original pattern designed in a preferred embodiment according to the invention.

An original active pattern used in a preferred embodiment according to the invention is shown in FIG. 4. The original active pattern comprises patterns of, for example, a device region 40, poly-silicon layer 42, and well region 44.

Figure 5:
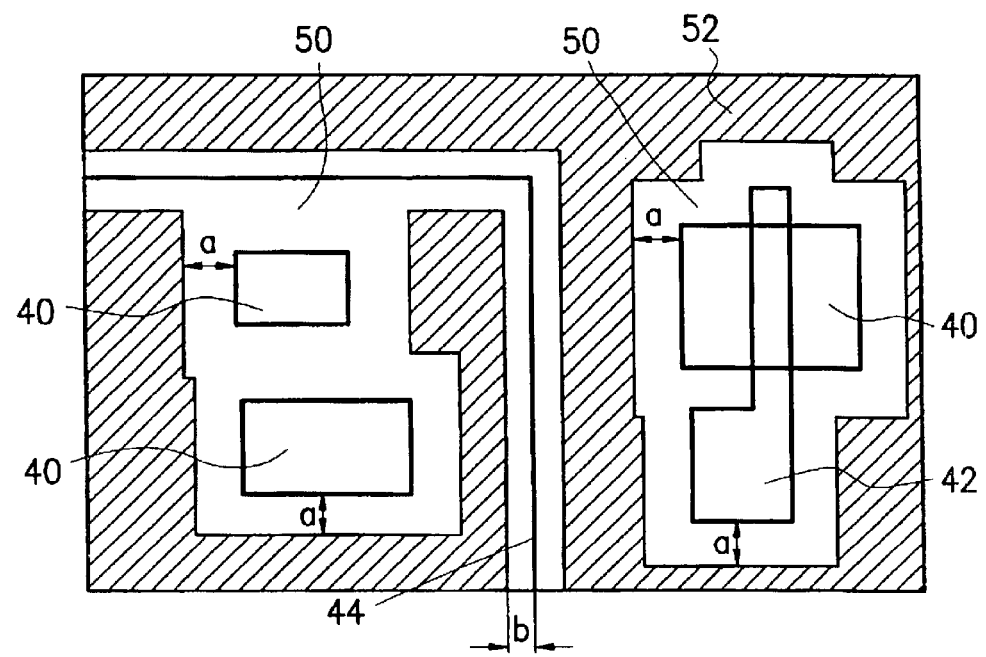
FIG. 5 shows a reverse pattern from expanding the original pattern shown in FIG. 4 with parameters of a and b.

FIG. 5 shows a reverse pattern of the original pattern shown in FIG. 4 with a parameters of a and b. The device region pattern 40 and the poly-silicon pattern 42 are expanded with a line width of a, for example, 1.4 $\mu$m. The margin of the well region 44 is expanded inwardly and outwardly with a parameter of line width b of, for example, 0.9 $\mu$m. While the device region pattern 40, the poly-silicon region 42 and the well region overlap with one another due to expansion, the patterns of these regions merge as a first region pattern 50. By reverse logic calculation (NOR operation), for example, reverse tone, a second region pattern 52 is obtained by subtracting the first region pattern 50.

Figure 6A:
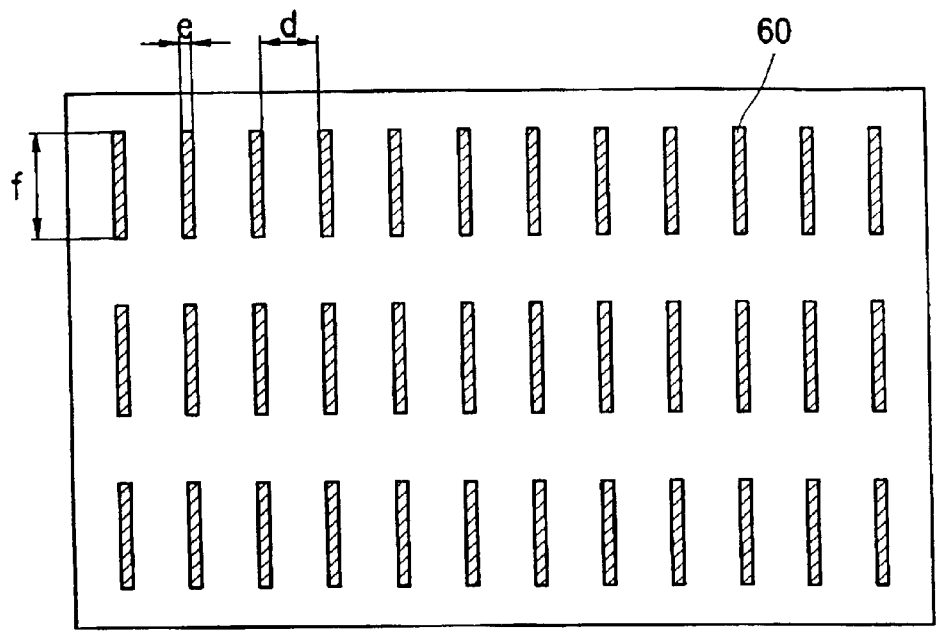
FIG. 6A shows a dummy pattern designed in a preferred embodiment according to the invention.

FIG. 6A shows a dummy pattern 60 employed in this embodiment according to the invention. The dummy pattern 60 comprises an array of a plurality of elements. The elements are equidistantly spaced with a distance of d, for example, 1.8 $\mu$m. Each element of the array has a width of e and a length of f, for example, 0.2 $\mu$m. and 2.2 $\mu$m. respectively.

Figure 6B:
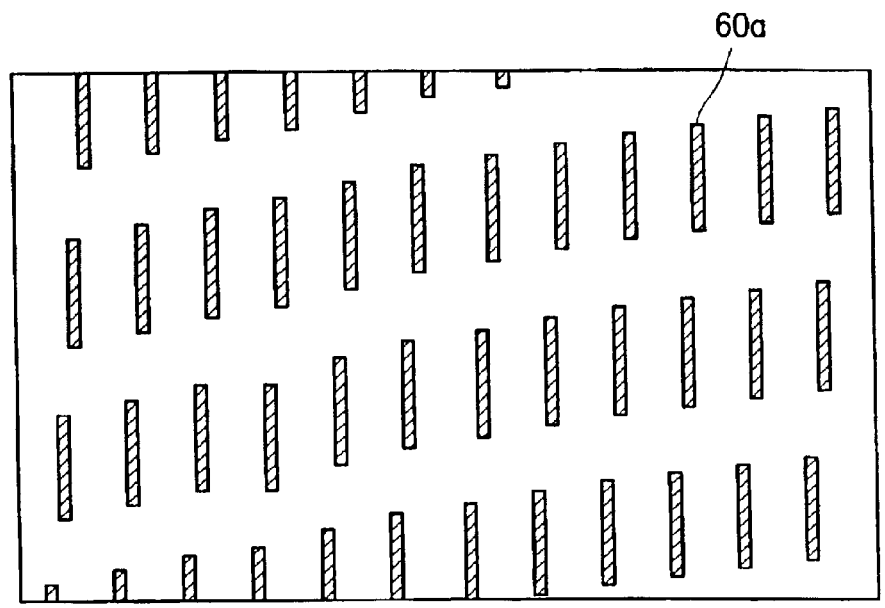
FIG. 6B shows a shifted dummy patterned of the dummy pattern shown in FIG. 6A.

In FIG. 6B, a dummy pattern 60a is shown by shifting the dummy pattern shown in FIG. 6A in both longitudinal and transverse directions with a certain distance, for example, 0.2 $\mu$m.

Figure 7A:
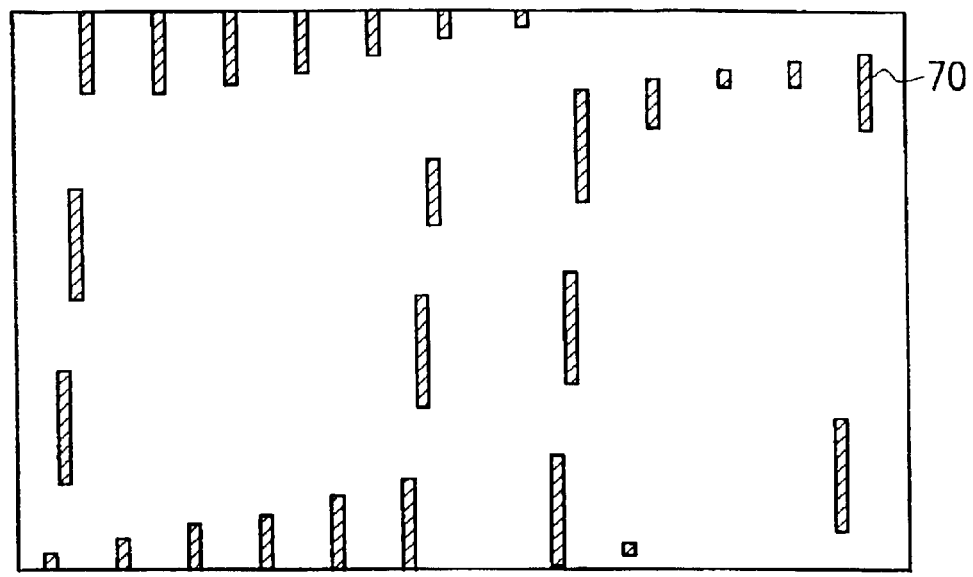
FIG. 7A shows a combined pattern of the patterns shown in FIG. 5 and FIG. 6B.

In FIG. 7A, combining the patterns shown in FIG. 5 and FIG. 6B, an overlapped region of the second region pattern 52 in FIG. 5 and the shifted dummy pattern 60a in FIG. 6b is extracted as a combined pattern 70. That is, an AND operation is performed to extract the combined pattern 70 from the patterns shown in FIG. 5 and FIG. 6B.

Figure 7B:
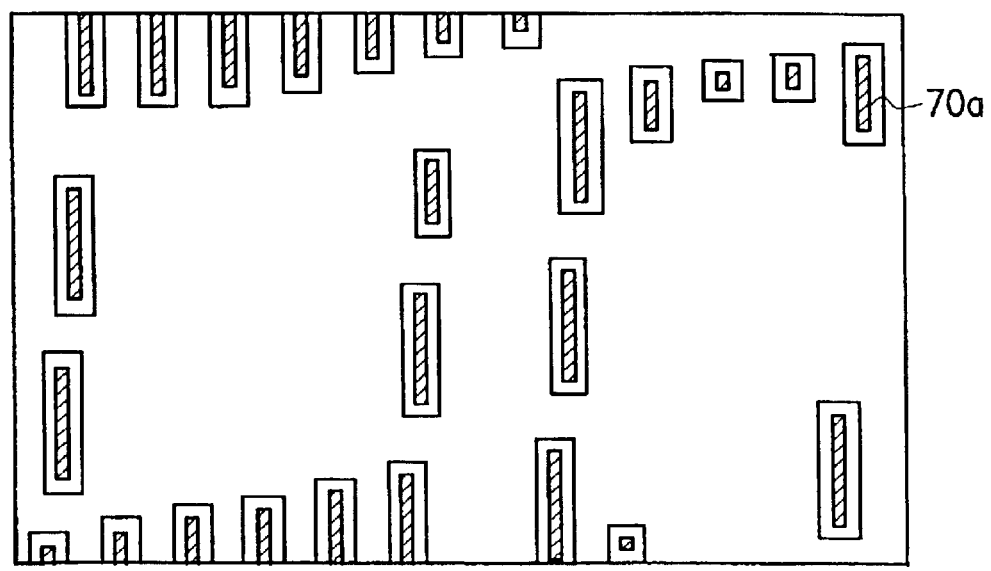
FIG. 7B shows an expansion of the combined pattern shown in FIG. 7A.

The combined pattern 70 shown in FIG. 7A is then expanded with a parameter of line width c, for example, 0.4 $\mu$m. The resultant dummy pattern 70a is shown as FIG. 7B.

Figure 8:
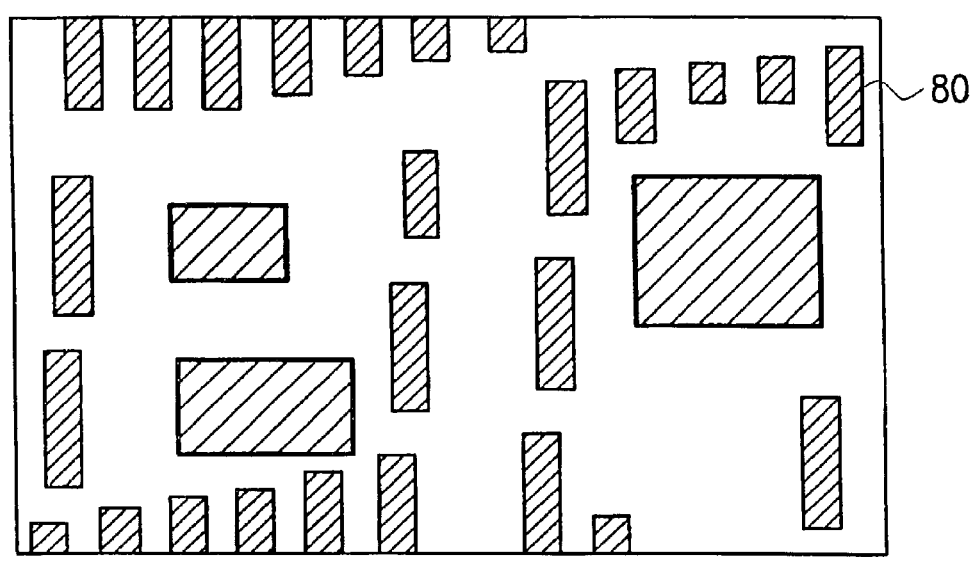
FIG. 8 shows an active region pattern with a dummy pattern in a preferred embodiment according to the invention.

By adding the resultant dummy pattern 70a into the original active region pattern shown in FIG. 4, an active region pattern with a dummy pattern 80 is formed and shown in FIG. 8. The active region pattern with a dummy pattern 80 is then applied in chemical mechanical polishing technique for forming shallow trench isolation.

One advantage of the invention is that by adding the dummy pattern to the active region pattern, the large isolation region is partitioned by the dummy pattern, so that the possibility of forming a recess is suppressed.

A further advantage of the invention is that by adding a shifted dummy pattern, an identical parasitic capacitance is obtained between the active region pattern and each of the metal lines formed subsequently. Therefore, an equivalent RC time delay caused between each metal line and the active region pattern is obtained. The performance of the device is thus upgraded.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. An integrated circuit, comprising:

a plurality of active patterns;

a plurality of dummy patterns, wherein the dummy patterns are positioned around the active pattern; and a plurality of conductive lines over the active patterns and dummy patterns, wherein the conductive lines cover different parts of the dummy patterns, in which parasitic capacitance is generated between each conductive line and each dummy patterns under each conductive line, and parasitic capacitance of each conductive lines is substantially identical.

2. The integrated circuit according to claim 1, wherein the active patterns comprise a plurality of a device region patterns and a plurality of well regions.

3. The integrated circuit according to claim 2, wherein the conductive lines comprise a plurality of poly-silicon lines.

4. The integrated circuit according to claim 1, wherein the conductive lines comprise a plurality of poly-silicon lines.

5. The integrated circuit according to claim 1, wherein the dummy patterns have an array having a plurality of columns of elements.

6. The integrated circuit according to claim 5, wherein at least two adjacent columns of the array arc covered by the same conductive line.

7. The integrated circuit according to claim 5, wherein at least two adjacent conductive lines cover the same column of the array.

8. The integrated circuit according to claim 5, wherein the elements of cach columns are arranged in a first direction and each of the conductive lines extends in a second direction, wherein an angle between the first direction and the second direction is larger than zero.

9. An integrated circuit, comprising:

a plurality of active patterns;

a plurality of dummy patterns, wherein the dummy patterns are positioned around the active pattern; and a plurality of conductive lines over the active patterns and dummy patterns, wherein the conductive lines cover different parts of the dummy patterns, in wbich parasitic capacitance is generated between each conductive line and each dummy patterns and each active patterns under each conductive line, and parasitic capacitance of each conductive lines is substantially identical.

10. The integrated circuit according to claim 9, wherein the active patterns comprise a plurality of a device region patterns and a plurality of well regions.

11. The integrated circuit according to claim 10, wherein the conductive lines comprise a plurality of poly-siicon lines.

12. The integrated circuit according to claim 10, wherein the dummy patterns have an array having a plurality of columns of elements.

13. The integrated circuit according to claim 12, wherein at least two adjacent columns of the array are covered by the same conductive line.

14. The integrated circuit according to claim 12, wherein at least two adjacent conductive lines cover the same column of the array.

15. The integrated circuit according to claim 12, wherein the elements of each column are arranged in a first direction and each of the conductive lines extends in a second direction, wherein an angle between the first direction and the second direction is larger than zero.

16. The integrated circuit according to claim 9, wherein the conductive lines comprise a plurality of poly-siicon lines.

* * * * *

UNITED STATES PATENT AND TRADEMARK OFFICE
CERTIFICATE OF CORRECTION

PATENT NO. : 6,810,511 B2  
APPLICATION NO. : 10/284683  
DATED : October 26, 2004  
INVENTOR(S) : Coming Chen et al.

Page 1 of 1

It is certified that error appears in the above-identified patent and that said Letters Patent is hereby corrected as shown below:

In the Claims:

In claim 1, at column 4, line 22, replace "each conductive line" with --each of the conductive lines--.
In claim 1, at column 4, line 23, replace "each dummy patterns" with --each of the dummy patterns--.
In claim 1, at column 4, line 23, replace "each conductive line" with --each of the conductive lines--.
In claim 1, at column 4, line 24, replace "each conductive lines" with --each of the conductive lines--.
In claim 2, at column 4, line 27, replace "a plurality of a device region patterns" with --a plurality of device region patterns--.
In claim 4, at column 4, line 32, replace "ofpoly-silicon" with --of poly-silicon--.
In claim 6, at column 4, line 37, replace "arc" with --are--.
In claim 8, at column 4, line 43, replace "cach" with --each--.
In claim 9, at column 4, line 54, replace "wbich" with --which--.
In claim 9, at column 4, line 55, replace "each conductive line" with --each of the conductive lines--.
In claim 9, at column 4, line 56, replace "each dummy patterns" with --each of the dummy patterns--.
In claim 9, at column 4, line 56, replace "each active patterns" with --each of the active patterns--.
In claim 9, at column 4, line 57, replace "each conductive line" with --each of the conductive lines--.
In claim 9, at column 4, line 58, replace "each conductive lines" with --each of the conductive lines--.
In claim 10, at column 4, line 60, replace "a plurality of a device region patterns" with --a plurality of device region patterns--.
In claim 11, at column 4, line 63, replace "poly-siicon" with --poly-silicon--.
In claim 15, at column 6, line 2, replace "whercin" with --wherein--.
In claim 16, at column 6, line 5, replace "poly-siicon" with --poly-silicon--.

Signed and Sealed this  
Fourteenth Day of May, 2013

Teresa Stanek Rea  
*Acting Director of the United States Patent and Trademark Office*